(12) United States Patent
Huang

(10) Patent No.: US 10,373,886 B2
(45) Date of Patent: Aug. 6, 2019

(54) PREFORMED LEAD FRAME AND LEAD FRAME PACKAGED STRUCTURE INCLUDING THE SAME

(71) Applicant: Chang Wah Technology Co., Ltd., Kaohsiung (TW)

(72) Inventor: Chia-Neng Huang, Kaohsiung (TW)

(73) Assignee: Chang Wah Technology Co., Ltd., Kaohsiung (TW)

( * ) Notice: Subject to any disclaimer, the term of this patent is extended or adjusted under 35 U.S.C. 154(b) by 0 days.

(21) Appl. No.: 15/591,552

(22) Filed: May 10, 2017

(65) Prior Publication Data
US 2018/0211903 A1 Jul. 26, 2018

(30) Foreign Application Priority Data
Jan. 24, 2017 (TW) .............................. 106201265 U

(51) Int. Cl.
*H01L 23/495* (2006.01)
*H01L 23/31* (2006.01)
*H01L 21/56* (2006.01)

(52) U.S. Cl.
CPC ........ *H01L 23/3121* (2013.01); *H01L 21/561* (2013.01); *H01L 23/49541* (2013.01); *H01L 23/49582* (2013.01); *H01L 2224/32225* (2013.01); *H01L 2224/32245* (2013.01); *H01L 2224/48091* (2013.01); *H01L 2224/48247* (2013.01); *H01L 2224/73265* (2013.01); *H01L 2224/85005* (2013.01); *H01L 2224/97* (2013.01); *H01L 2924/181* (2013.01)

(58) Field of Classification Search
None
See application file for complete search history.

(56) References Cited

U.S. PATENT DOCUMENTS 8,652,879 B2 2/2014 Ondhasitthichai et al.
2013/0280866 A1* 10/2013 Nondhasitthichai .... H01L 21/56 438/124

* cited by examiner

*Primary Examiner* — Daniel Whalen
(74) *Attorney, Agent, or Firm* — DLA Piper LLP (US)

(57) ABSTRACT

A preformed lead frame includes a metallic substrate, a plurality of spaced-apart conductive lead frame units and intersecting trenches, a molding layer, and a plurality of conductive pads. The lead frame units and the molding layer are formed on the substrate. Each of the lead frame units includes a die supporting portion, a plurality of lead portions surrounding and spaced apart from the die supporting portion, and a gap formed among the die supporting portion and the lead portions. The trenches are formed among the conductive lead frame units. The molding layer fills the gaps and the trenches. Each of the conductive pads is formed on a top surface of the die supporting portion of a respective one of the lead frame units.

7 Claims, 6 Drawing Sheets

US 10,373,886 B2

PREFORMED LEAD FRAME AND LEAD FRAME PACKAGED STRUCTURE INCLUDING THE SAME

CROSS-REFERENCE TO RELATED APPLICATION

This application claims priority of Taiwanese Patent Application No. 106201265, filed on Jan. 24, 2017.

FIELD

The disclosure relates to a lead frame, and more particularly to a preformed lead frame including a molding layer, and a lead frame packaged structure including the preformed lead frame.

BACKGROUND

Referring to FIG. 1, U.S. Pat. No. 8,652,879 B2 discloses a method for making a semiconductor package. The method involves forming a plurality of spaced-apart die pads 122 and a plurality of spaced-apart contact pads 124 on a metallic substrate 112 using electro-plating techniques, and then respectively disposing a plurality of die chips 132 on the die pads 122. Thereafter, each of the die chips 122 is electrically connected to one or more of the contact pads 124 using wires 134, followed by encapsulating the die chips 122 and the wires 134 with a molding material 142 to form a packaged semiconductor package assembly. Finally, the metallic substrate 112 is removed and then the semiconductor package assembly is singularized using dicing techniques to form a plurality of the semiconductor packages.

In the above structure of the semiconductor package assembly, there is a height difference from the die pads 122 to the metallic substrate 112. In light of the trend toward increased density of the semiconductor package assembly, and thus decreased size of the die pads 122, when the die pads 122 are miniaturized to have a size smaller than that of the die chips 132, the die chips 132 may tilt or move in the subsequent manufacturing process due to insufficient support provided by the die pads 122.

SUMMARY

Therefore, an object of the disclosure is to provide a preformed lead frame that can alleviate at least one of the drawbacks of the prior art.

According to one aspect of the disclosure, the preformed lead frame includes a metallic substrate, a plurality of spaced-apart conductive lead frame units, a plurality of intersecting trenches, a molding layer, and a plurality of conductive pads.

The lead frame units are formed on the substrate. Each of the lead frame units includes at least one die supporting portion having a top surface opposite to the substrate, a plurality of spaced-apart lead portions surrounding and spaced apart from the at least one die supporting portion, and a gap formed among the at least one die supporting portion and the lead portions.

The trenches are formed among the conductive lead frame units to isolate the conductive lead frame units from each other.

The molding layer is formed on the substrate and fills the gaps of the lead frame units and the trenches.

Each of the conductive pads is formed on the top surface of the at least one die supporting portion of a respective one of the lead frame units.

According to another aspect of the disclosure, a lead frame packaged structure includes the above preformed lead frame, a plurality of chips, a plurality of wire sets, and a polymeric encapsulant.

Each of the chips is adhered to a respective one of the conductive pads.

Each of the wire sets electrically interconnects a respective one of the chips with the lead portions of a corresponding one of the frame units.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
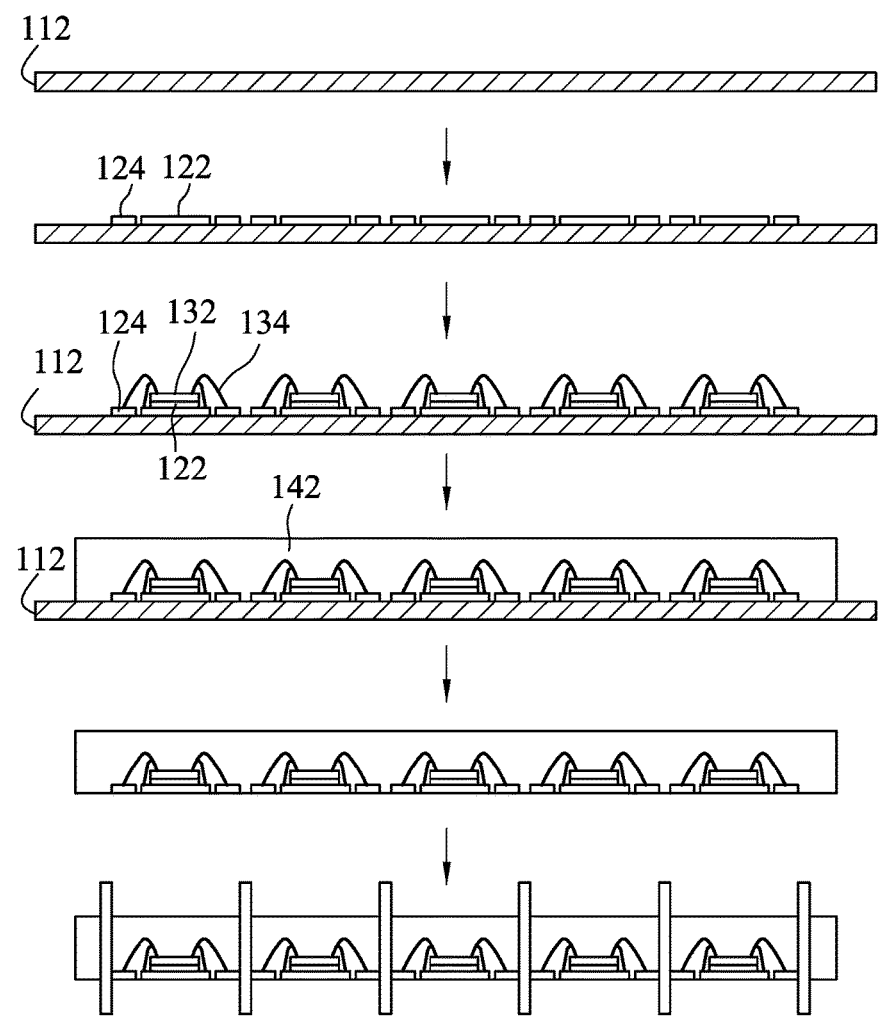
FIG. 1 is a schematic view illustrating consecutive steps of a method of making a conventional semiconductor package.
Figure 2:
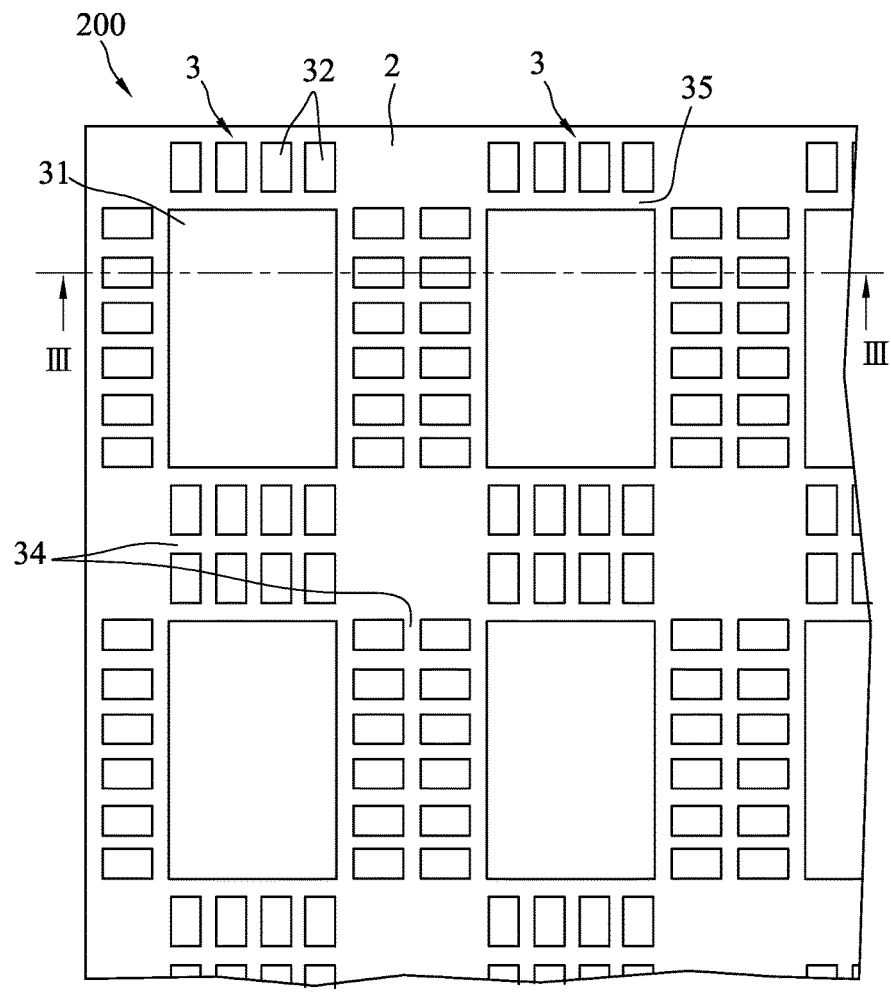
FIG. 2 is a fragmentary top view illustrating an embodiment of a preformed lead frame according to the disclosure.
Figure 3:
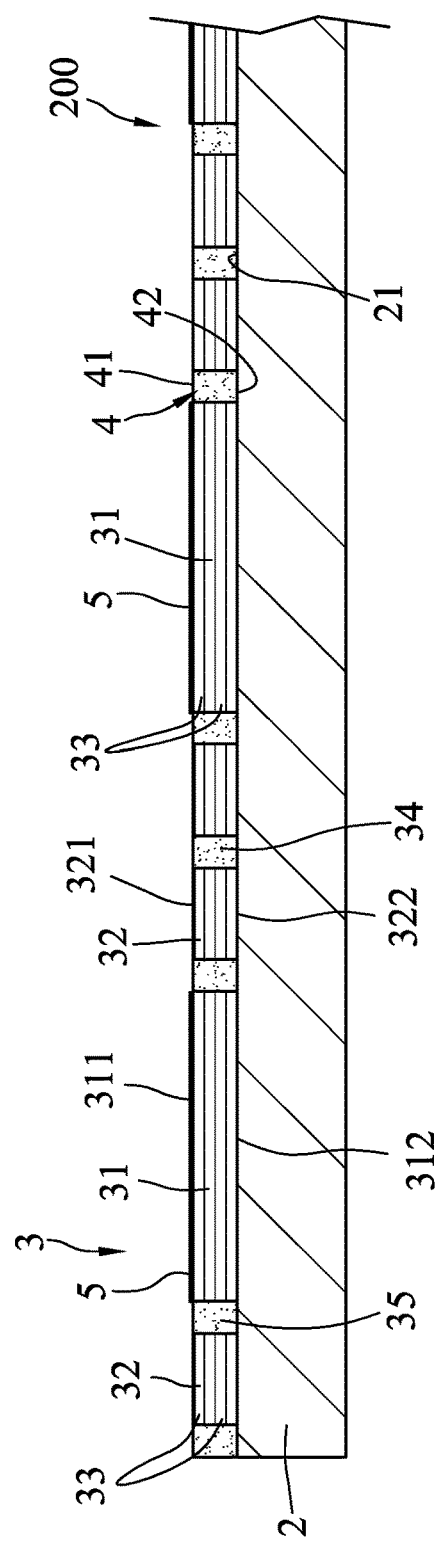
FIG. 3 is a fragmentary cross-sectional view taken along line III-III of FIG. 2.

Referring to FIGS. 2 and 3, an embodiment of a preformed lead frame 200 according to the disclosure includes a metallic substrate 2, a plurality of spaced-apart conductive lead frame units 3, a plurality of intersecting trenches 34, a molding layer 4, and a plurality of conductive pads 5.

The substrate 2 may be made of a metallic element or an alloy. More specifically, the substrate 2 is selectable from copper, a copper-based alloy, or an iron-nickel alloy.

The conductive lead frame units 3 are formed on a surface 21 of the substrate 2. Each of the lead frame units 3 includes at least one die supporting portion 31 that has a top surface 311 opposite to the substrate 2 and a bottom surface 312 opposite to the top surface 311 and connected to the metallic substrate 2, a plurality of spaced-apart lead portions 32 that surround the at least one die supporting portion 31 and that are spaced apart from the at least one die supporting portion 31, and a gap 35 that is formed among the at least one die supporting portion 31 and the lead portions 32. More specifically, the lead frame units 3 are arranged in an array. Each of the lead portions 32 of each of the lead frame units 3 has a top surface 321 and a bottom surface 322 opposite to the top surface 321 and connected to the metallic substrate 2. In the embodiment, the at least one die supporting portion 31 and the lead portions 32 of each of the lead frame units 3 respectively have a layered structure including a plurality of stacked layers 33. In one form, each of the layers 33 may be a single-layered structure or a multi-layered structure depending on the requirements of a subsequent packaging process. In the embodiment, the die supporting portion 31 and the lead portions 32 of each of the lead frame units 3 respectively have a four-layered structure composed of gold/palladium/nickel/palladium layers stacked in that order.

The trenches 34 are formed among the lead frame units 3 to isolate the conductive lead frame units 3 from each other.

The molding layer 4 is formed on the substrate 2 and fills the gaps 35 of the lead frame units 3 and the trenches 34. The molding layer 4 may be made from polymer materials. The molding layer 4 has a top surface 41 that is opposite to the substrate 2 and a bottom surface 42 that is opposite to the top surface 41 and that is connected to the substrate 2. In the embodiment, the top surface 41 of the molding layer 4 is flush with the top surface 311 of the at least one die supporting portion 31 of each of the lead frame units 3 and the top surfaces 321 of the lead portions 32 of each of the lead frame units 3.

Each of the conductive pads 5 is formed on the top surface 311 of the at least one die supporting portion 31 of a respective one of the lead frame units 3 for being subsequently electrically connected to a chip (not shown).

Figure 4:
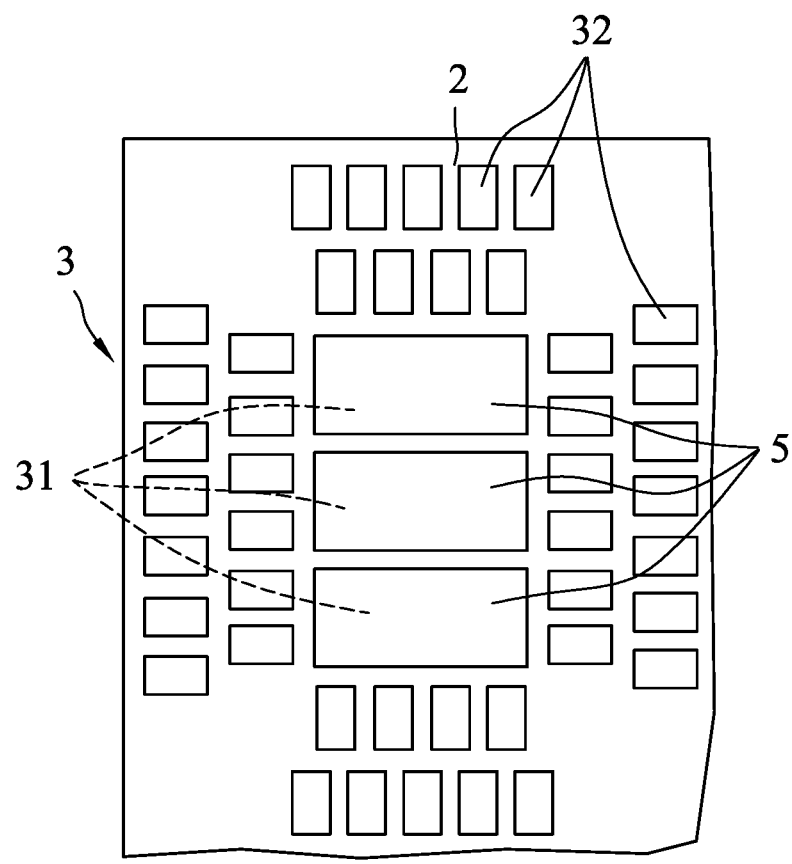
FIG. 4 is a fragmentary top view illustrating another configuration of the embodiment of the preformed lead frame.

Referring to FIG. 4, in another configuration of the preformed lead frame 200 according to the disclosure, each of the lead frame units 3 may include a plurality of the spaced-apart die supporting portions 31. The pads 5 may be respectively formed on the die supporting portions 31 of the lead frame units 3. The lead portions 32 of each of the lead frame units 3 may surround the die supporting portions 31 in one row or more rows. In this configuration, each of the lead frame units 3 includes three spaced-apart die supporting portions 31, and the leads portions 32 surround the die supporting portions in two rows.

Figure 5:
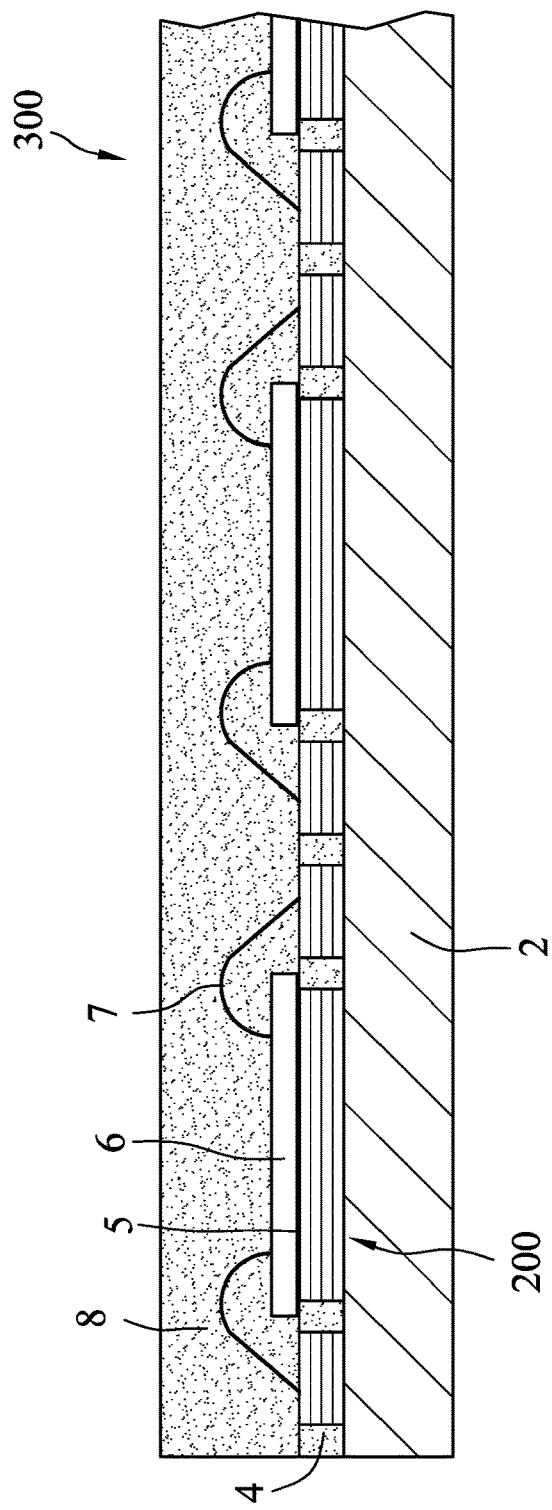
FIG. 5 is a fragmentary schematic view illustrating an embodiment of a lead frame packaged structure according to the disclosure.

Referring to FIG. 5, the preformed lead frame 200 of the disclosure may be further provided with a plurality of chips 6, a plurality of wire sets 7 and a polymeric encapsulant 8 to form a lead frame packaged structure 300.

Each of the chips 6 is adhered to a respective one of the conductive pads 5 for being electrically connected to an external device. The wire sets 7 are made from an electrically conductive material. Each of the wire sets 7 electrically interconnects a respective one of the chips 6 with the lead portions 31 of a corresponding one of the lead frame units 3. The encapsulant 8 is electrically insulating, and encapsulates the preformed lead frame 200, the chips 6 and the wire sets 7. Since the chips 6 and the wire sets 7 are formed posterior to the formation of the molding layer 4 and prior to the formation of the encapsulant 8, the encapsulant 8 and the molding layer 4 are optionally made from the identical or different materials.

Figure 6:
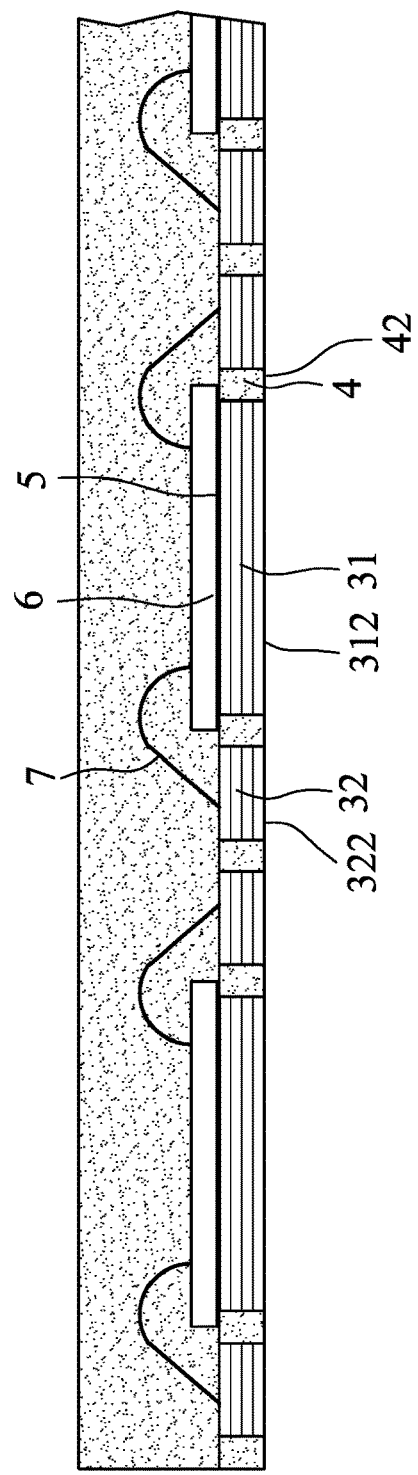
FIG. 6 is a fragmentary schematic view illustrating the lead frame packaged structure of FIG. 5 where a substrate is removed.

Prior to the electrical connection of the lead frame packaged structure 200 to a circuit board (not shown), the substrate 2 is first removed so as to expose the bottom surface 42 of the molding layer 4 and the bottom surfaces 312, 322 of the die supporting portions 31 and the lead portions 32 (as shown in FIG. 6). The bottom surface 42 of the molding layer 4 is flush with the bottom surfaces 312 of the die supporting portions 31 of each of the lead frame units 3 and the bottom surfaces 322 of the lead portions 32 of each of the lead frame units 3. Then the exposed bottom surfaces 312, 322 of the die supporting portions 31 and the lead portions 32 can be electrically connected to the circuit board (not shown).

In summary, by virtue of the filling of the gaps 35 of the lead frame units 3 and the trenches 34 with the molding layer 4, each of the chips 6 having greater area size than that of the corresponding one of the die supporting portions 31 can be stably disposed on the die supporting portions 31 with additional support provided by the molding layer 4. Therefore, the insufficient support of the conductive lead frame units 3 caused by the conventional lead frame units can be avoided. Furthermore, the molding layer 4 can also support the wire sets 7 so that collapse of the wire sets 7 can be avoided.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A preformed lead frame, comprising:
    a metallic substrate;
    a plurality of spaced-apart conductive lead frame units formed on said substrate, each of said lead frame units including at least one die supporting portion having a top surface opposite to said substrate, a plurality of spaced-apart lead portions surrounding and spaced apart from said at least one die supporting portion, and a gap formed among said at least one die supporting portion and said lead portions;
    a plurality of intersecting trenches formed among said conductive lead frame units to isolate said conductive lead frame units from each other;
    a molding layer formed on said substrate and filling said gaps of said lead frame units and said trenches; and
    a plurality of conductive pads each formed on said top surface of said at least one die supporting portion of a respective one of said lead frame units,
    wherein each of said lead portions of each of said lead frame units has a top surface opposite to said substrate, said molding layer having a top surface that is opposite to said substrate and that is flush with said top surface of said at least one die supporting portion of each of said lead frame units and said top surfaces of said lead portions of each of said lead frame units such that said top surface of said at least one die supporting portion of each of said lead frame units and said top surfaces of said lead portions of each of said lead frame units are exposed from said molding layer.

2. The preformed lead frame of claim 1, wherein said at least one die supporting portion of each of said lead frame units includes a plurality of said spaced-apart die supporting portions, said conductive pads being respectively formed on said die supporting portions of said lead frame units.

3. The preformed lead frame of claim 1, wherein said at least one die supporting portion and said lead portions of each of said lead frame units respectively have a layered structure.

4. A lead frame packaged structure, comprising:
the preformed lead frame as claimed in claim 1;
a plurality of chips, each of which is adhered to a respective one of said conductive pads;
a plurality of wire sets, each of which electrically interconnects a respective one of said chips with said lead portions of a corresponding one of said lead frame units; and
a polymeric encapsulant encapsulating said preformed lead frame, said chips and said wire sets.

5. The lead frame packaged structure of claim 4, wherein each of said lead portions of each of said lead frame units has said top surface and a bottom surface, said molding layer having said top surface and a bottom surface, said top surface of said molding layer being flush with said top surface of said at least one die supporting portion of each of said lead frame units and said top surfaces of said lead portions of each of said lead frame units, said bottom surface of said molding layer being flush with said bottom surface of said at least one die supporting portion of each of said lead frame units and said bottom surfaces of said lead portions of each of said lead frame units.

6. The lead frame packaged structure of claim 4, wherein said at least one die supporting portion of each of said lead frame units includes a plurality of said spaced-apart die supporting portions, said conductive pads being respectively formed on said die supporting portions of said lead frame units.

7. The lead frame packaged structure of claim 4, wherein said at least one die supporting portion and said lead portions of each of said conductive lead frame units respectively have a layered structure.

\* \* \* \* \*